(12) United States Patent
Wang

(10) Patent No.: US 7,830,025 B2
(45) Date of Patent: Nov. 9, 2010

(54) CONTACT LAYOUT STRUCTURE

(75) Inventor: Wen-Chieh Wang, Hsinchu (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 120 days.

(21) Appl. No.: 12/122,733

(22) Filed: May 19, 2008

(65) Prior Publication Data

US 2009/0283921 A1 Nov. 19, 2009

(51) Int. Cl.
*H01L 23/48* (2006.01)
(52) U.S. Cl. ............... 257/786; 257/202; 257/204; 257/E23.01; 438/128; 438/612; 438/666
(58) Field of Classification Search ......... 257/202–211, 257/457, 459, 319, 786, E23.01; 438/6, 128, 438/587, 612, 666
See application file for complete search history.

(56) References Cited

U.S. PATENT DOCUMENTS

| 5,309,386 A | 5/1994 | Yusuki |
| 6,727,026 B2 | 4/2004 | Kuji et al. |
| 2002/0190398 A1* | 12/2002 | Morishima et al. .......... 257/903 |
| 2010/0096671 A1* | 4/2010 | Becker et al. ............... 257/206 |

* cited by examiner

*Primary Examiner*—Victor A Mandala
*Assistant Examiner*—Whitney Moore
(74) *Attorney, Agent, or Firm*—Winston Hsu; Scott Margo; Min-Lee Teng

(57) ABSTRACT

A contact layout structure includes a substrate having at least a first region defined thereon, plural sets of first contact layouts positioned along a predetermined direction in the first region, and a plurality of second contact layouts positioned in the first region. Each set of the first contact layout has two square contact units and two adjacent rectangle contact units positioned between the two square contact units.

10 Claims, 4 Drawing Sheets

CONTACT LAYOUT STRUCTURE

BACKGROUND OF THE INVENTION

1. Field of the Invention

The invention relates to a contact layout structure, and more particularly, to a contact layout structure positioned in a dense region.

2. Description of the Prior Art

Photolithography process has been an essential process in semiconductor manufacturing procedures. It includes steps of providing a photomask or photomasks having designed patterns such as circuit patterns, doped region patterns, or contact layout patterns and transferring said patterns to a photoresist formed on a substrate by an exposure step and a development step, thus those complicated patterns are obtained on the semiconductor chips precisely. After the photolithography process, implantations or etching processes are performed to construct those intricate circuit structures.

With a trend toward miniaturization of the semiconductor industry, and improvement in semiconductor manufacturing process, it is capable of forming both dense regions and iso regions on one chip. However, it is well-known that critical dimension (CD) of a layout pattern such as a contact layout pattern always faces an optical limit. In particular, an undesired condition that the opening merged in the dense regions is often found in after-development-inspection (ADI).

In addition, please refer to FIG. 1, which is a cross-sectional view of a conventional share contact opening. As shown in FIG. 1, a share contact opening 110 is positioned in a dense region such as a static random access memory (SRAM) region 102 of a substrate 100. The substrate 100 further includes a plurality of shallow trench isolations (STIs) 104 used to provide electrical isolation. The share contact opening 110 is formed in a dielectric layer 140 for forming a share contact (not shown) in following process. The share contact is used to electrically connect a source/drain 124, which is on an active region, of a transistor 120 and a gate 132 of another transistor 130, which is also formed on the active region, to an upper circuit layer. As shown in FIG. 1, because the share contact connects source/drain 124 and gate 132 of different transistor 120, 130, the share contact opening 110 is often made larger than conventional contact opening 112.

It is noteworthy that in the etching process used to form the contact opening, micro-loading effect caused by density difference between the dense region and the iso region often makes etch ratio in the dense region lower than that in the iso region. Furthermore, another problem is found in the dense region: because the share contact opening 110 is larger than the other contact opening 112, it is found that, in the same etching process, the conventional contact opening 112 has not been completely formed while the share contact opening 110 is well formed. In other words, when the conventional contact opening 112 is completely formed, the share contact opening 110 will be over-etched, even causing damage to the underneath transistor or the active region and thus adversely influences the yield. Those skilled in the art will easily conclude that although the share contact increases the utility rate of the valuable chip area, it simultaneously raises difficulty or complexity of the etching process control.

Therefore, a contact layout structure is needed to fundamentally avoid openings from the merging problem found in ADI and to avoid problems happening to process control as mentioned above.

SUMMARY OF THE INVENTION

It is therefore a primary objective of the claimed invention to provide a contact layout structure capable of avoiding openings merging found in ADI and simplifying etching process control.

According to the claimed invention, a contact layout structure is provided. The contact layout structure comprises a substrate having at least a first region defined thereon, plural sets of first contact layouts positioned along a predetermined direction in the first region, and a plurality of second contact layouts positioned in the first region. Each set of the first contact layouts comprises two square contact units and two adjacent rectangle contact units positioned in between the two square contact units.

According to the claimed invention, another contact layout structure is provided. The contact layout structure comprises a substrate, at least a first region comprising a plurality of active regions and a plurality of gate line regions defined on the substrate, a plurality of square contact units respectively positioned in the active region of the first region, and a plurality of rectangle contact units respectively positioned in the gate line region of the first region.

According to the contact layout structure provided by the present invention, the two adjacent rectangle contact units that are positioned in between the two square contact units or on the gate line regions are rendered to obtain more valuable spaces in the dense region, and to avoid the merging problem happening between the rectangle contact unit and the square contact unit found in ADI. Furthermore, one rectangle contact unit and one adjacent square contact unit are able to replace a conventional share contact to avoid the dilemmatic problem of obtainment of either incomplete conventional contact openings or forming over-etched share contact openings in one same etching process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
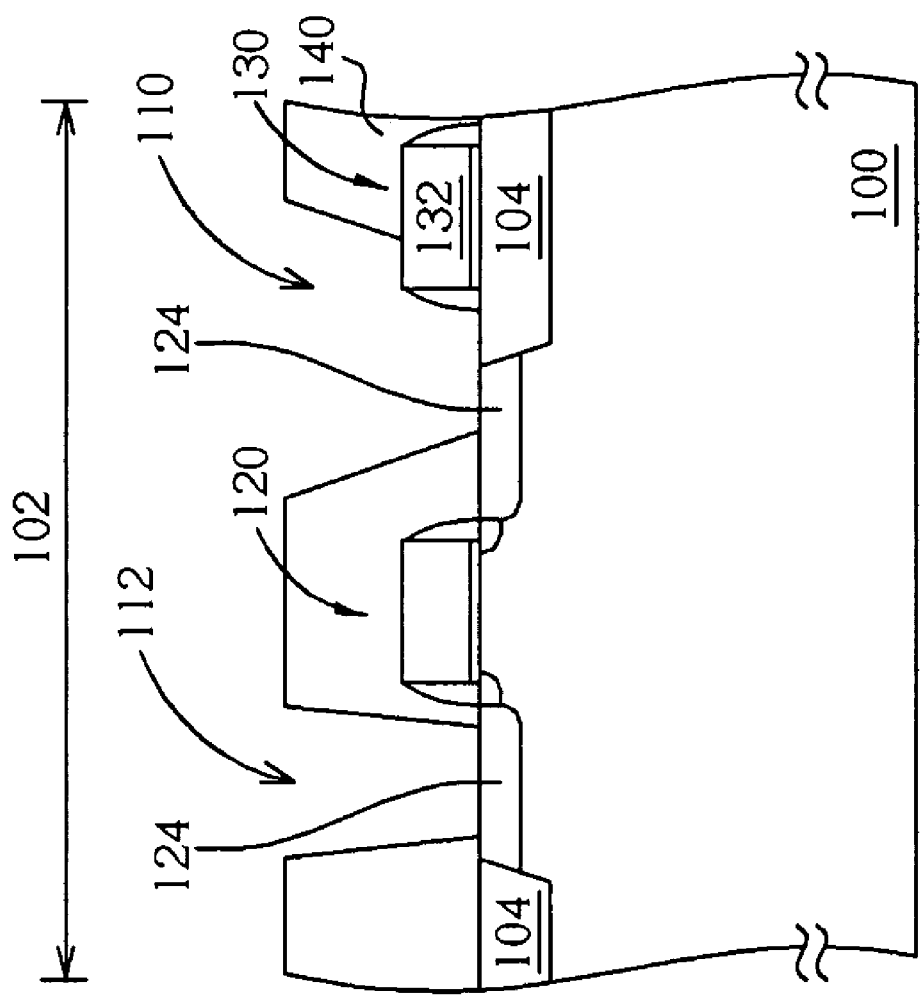
FIG. 1 is a cross-sectional view of a conventional share contact opening.
Figure 2:
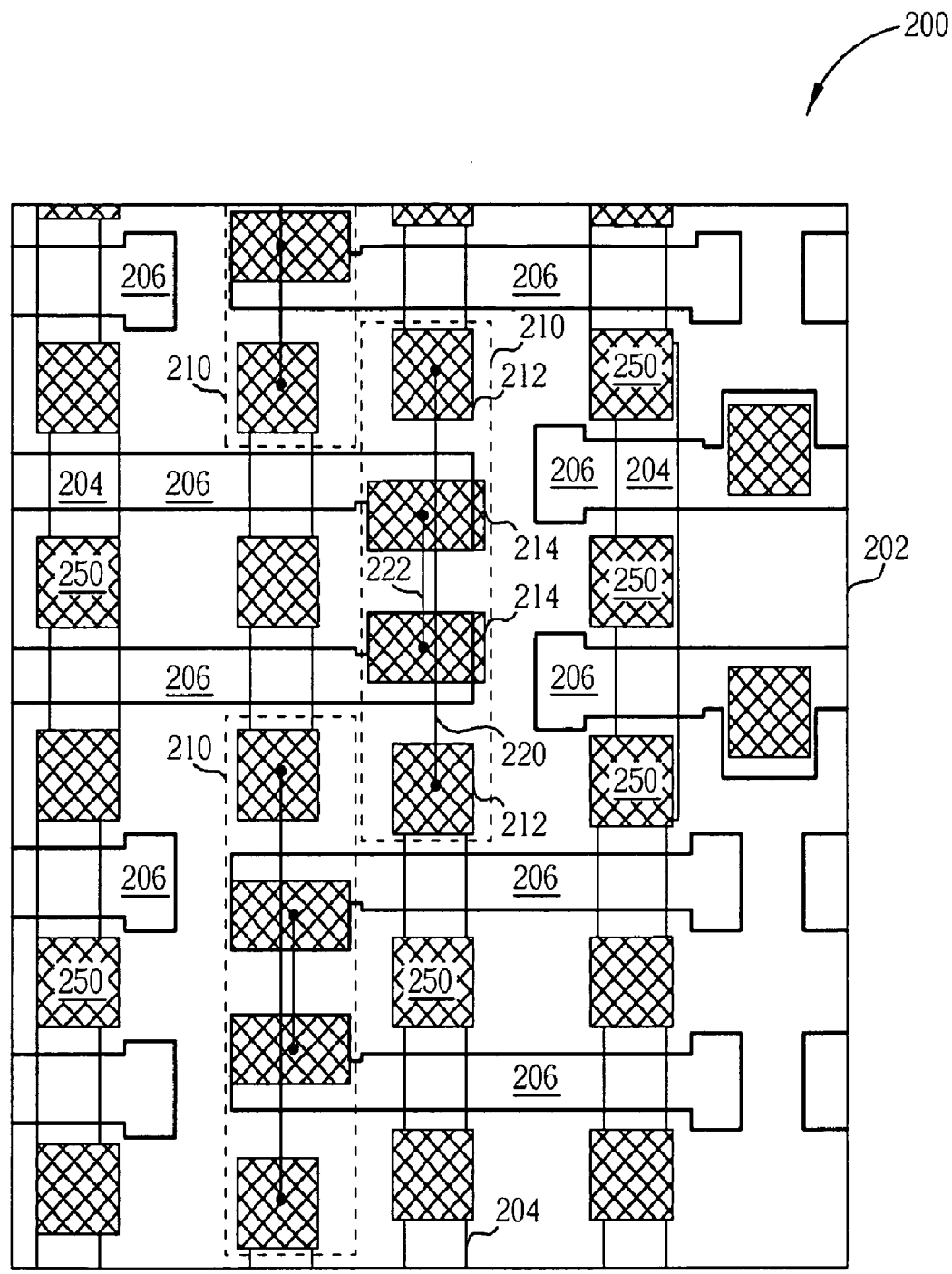
FIGS. 2 and 3 are schematic drawings of a contact layout structure provided by a preferred embodiment of the present invention.
Figure 3:
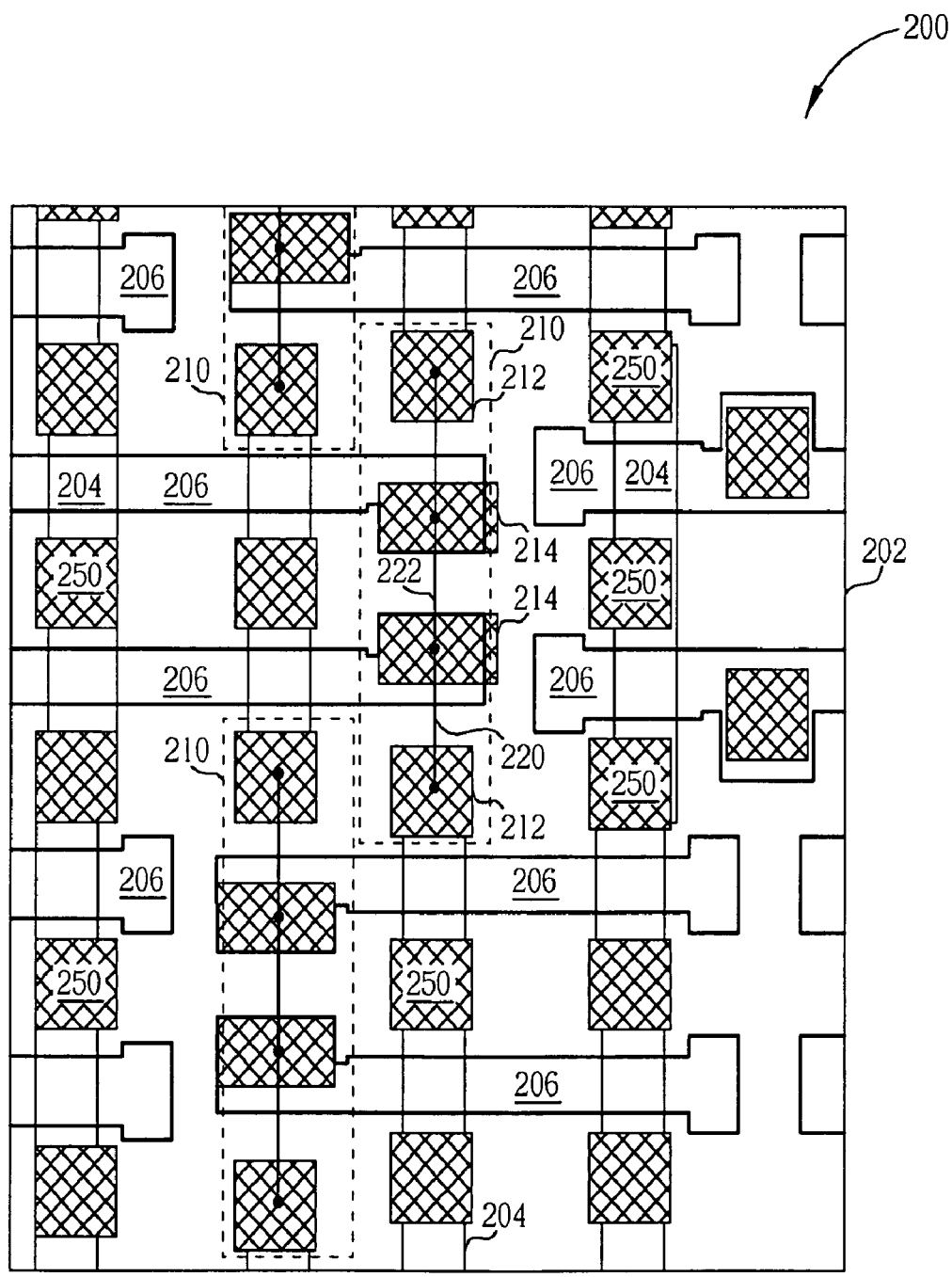

Please refer to FIGS. 2 and 3, which are schematic drawings of a contact layout structure provided by a preferred embodiment of the present invention. As shown in FIG. 2, a substrate 200 having at least a first region 202 is provided. The first region 202 can be a dense region, for example, the first region 202 is a static random access memory (SRAM) region. The substrate 200 further comprises at least a second region (not shown), which comprises iso region.

Please refer to FIG. 2 again. The contact layout structure provided by the preferred embodiment further comprises plural sets of first contact layout 210 positioned along a predetermined direction in the first region 200. The predetermined direction is a Y-axis direction in the present preferred embodiment. However, it is not limited to this, and the predetermined direction can be an X-axis direction in other modifications of the present embodiment. Each set of the first contact layouts 210 comprises two square contact units 212 and two adjacent rectangle contact units 214 positioned in between the two square contact units 212. A width-to-length ratio of the rectangle contact unit 214 is between 1:1.8 and 1:1.2. An area ratio of the rectangle contact unit 214 to the square contact unit 212 is between 1:0.8 and 1:1.2. It is noteworthy that the two rectangle contact units 214 are adjacent with its long sides and the long sides of the rectangle contact units 214 are parallel with each other. And the long sides of the rectangle contact unit 214 are perpendicular to the predetermined direction.

Additionally, a connection line 220 of center points of the two square contact units 212 is parallel with a connection line 222 of center points of the two rectangle contact units 214 as shown in FIG. 2. In a modification of the present preferred embodiment, the connection line 222 of the center points of the two rectangle contact units 214 overlaps the connection line 220 of the center points of the two square contact units 212, as shown in FIG. 3.

In the present preferred embodiment, the contact layout structure further comprises a plurality of second contact layouts 250 positioned in the first region 202. The second contact layouts 250 respectively have a square contact unit.

Figure 4:
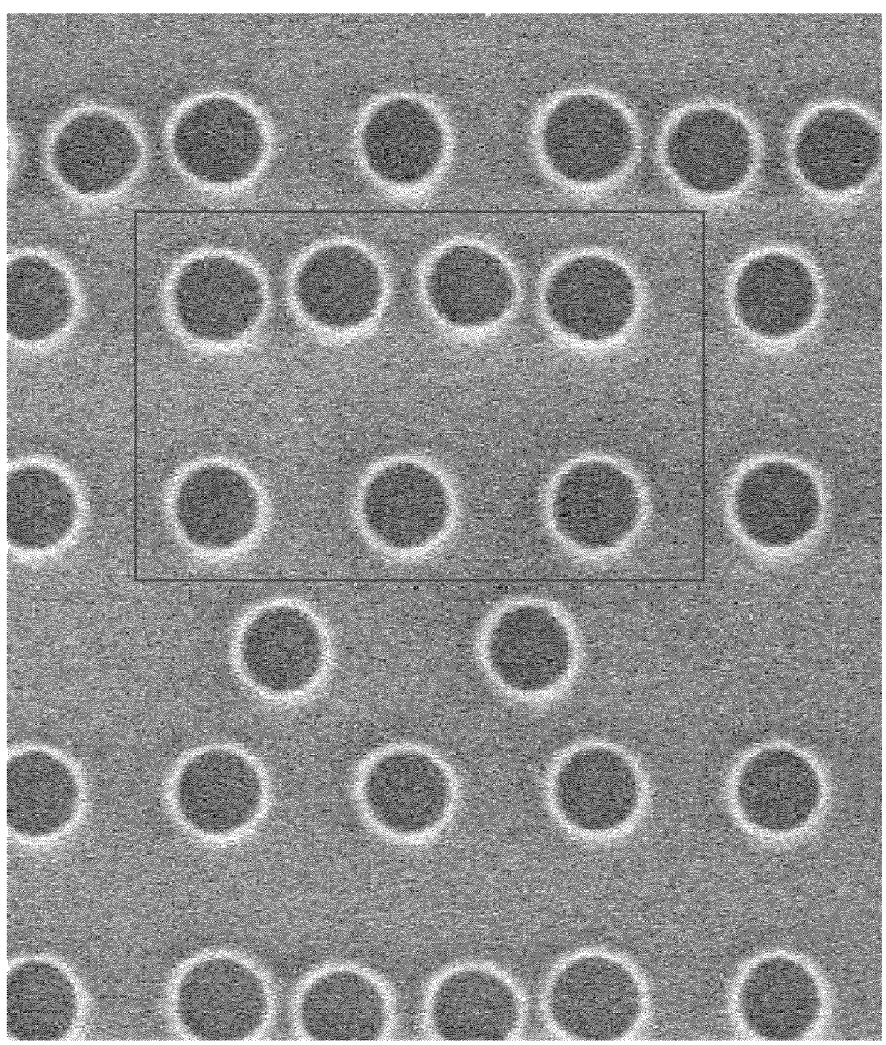
FIG. 4 is a SEM photograph of a contact opening pattern formed by the contact layout structure provided by the present invention.

Please refer to FIG. 4, which is a SEM photograph of a contact opening pattern formed by the contact layout structure provided by the present invention. It is noteworthy that, in an exposure step used to transfer the contact layouts, both square and rectangle layout units are transformed into round shapes due to the main lope and the side lope of different intensity distributions of the incident light. Thus the obtained contact openings are all in round shapes, as shown in FIG. 4.

The contact layout structure provided by the present preferred embodiment is more preferable to dense regions of a chip. Since a great amount of contacts are to be formed in the limited dense region, the contact layout structure provides two adjacent rectangle contact units 214 that are positioned between the two square contact units 212 to obtain more valuable spaces in the dense region of a chip. Furthermore, to prevent contact openings from merging problem found in ADI, the rectangle contact units 214 are positioned with its long side perpendicular to the predetermined direction, therefore a spacing between the rectangle contact unit 214 and its adjacent square contact unit 212 is larger than a spacing between the square contact units if the first contact layout 210 comprises all square contact units. Accordingly, openings merging of the rectangle contact unit 214 and the square contact unit 212 found in ADI is avoided.

Please refer to FIGS. 2 and 4 again, which illustrate another preferred embodiment of the present invention. According to the preferred embodiment, the first region 202 further comprises a plurality of active regions 204 and a plurality of gate line regions 206 respectively corresponding to active regions and gate line regions of a chip. As shown in FIG. 2, the contact layout structure provided by the preferred embodiment comprises a plurality of square contact units 212/250 respectively positioned in the active region 204 of the first region 202 and a plurality of rectangle contact units 214 respectively positioned in the gate line region 206 of the first region 202. The long sides of the rectangle contact units 214 are parallel with an extending direction of the gate line region 206. Furthermore, the rectangle contact units 214 are arranged by twos, and long sides of the adjacent rectangle contact units 214 are parallel with each other. As mentioned above, a width-to-length ratio of the rectangle contact unit 214 is between 1:1.8 and 1:1.2. And an area ratio of the rectangle contact unit 214 to the square contact unit 212/250 is between 1:0.8 and 1:1.2.

According to the contact layout structure provided by the preferred embodiment, the rectangle contact units 214 are positioned in the gate line regions 206 with its long side parallel with the extending direction of the gate line region 206. Compared with the conventional contact layout that the both gate line regions 206 and the active region 204 are provided with square contact units, the contact layout structure provided by the preferred embodiment obtains larger spacing between the rectangle contact unit 214 and its adjacent square contact unit 212, thus opening merging problems found in ADI are avoided. Furthermore, since one rectangle contact unit 214 and its adjacent square contact unit 212, which possess substantially equal areas, are able to replace a conventional share contact layout, the openings formed in following etching process are more comparable. Therefore difficulty in conventional etching process control that is when the share contact openings are well formed, the conventional contact openings have not been completely formed, or when the conventional contact openings are completely, the share contact openings are already over-etched, is avoided.

In summary, the contact layout structure provided by the present invention renders the two adjacent rectangle contact units that are positioned in between the two square contact units or on the gate line region to obtain more valuable spaces in the dense region, and to avoid the merging problem happening between the rectangle contact units and the square contact unit found in ADI. Furthermore, one rectangle contact unit and its adjacent square contact unit are used to replace a conventional share contact layout to avoid the dilemmatic problem of obtainment of either incomplete conventional contact openings or forming over-etched share contact openings in the same etching process.

Those skilled in the art will readily observe that numerous modifications and alterations of the device and method may be made while retaining the teachings of the invention.

What is claimed is:

1. A contact layout structure comprising:
    a substrate having at least a first region defined thereon;
    plural sets of first contact layouts positioned along a predetermined direction in the first region, each set of the first contact layouts comprises:
        two square contact units of equal length; and
        two adjacent rectangle contact units positioned in between the two square contact units, each of the rectangle contact unit comprises two opposite long sides and two opposite short sides, a short side-to-long side length ratio of the rectangle contact unit is between 1:1.8 and 1:1.2; and
    a plurality of second contact layouts positioned in the first region.

2. The contact layout structure of claim 1, wherein the first region comprises a dense region.

3. The contact layout structure of claim 1, wherein the first region comprises a static random access memory (SRAM) region.

4. The contact layout structure of claim 1, wherein a connection line of center points of the two square contact units is parallel with a connection line of center points of the two rectangle contact units.

5. The contact layout structure of claim 4, wherein the connection line of the center points of the two rectangle contact units overlaps the connection line of the center points of the two square contact units.

6. The contact layout structure of claim 1, wherein the long sides of each rectangle contact unit is perpendicular to the predetermined direction.

7. A contact layout structure comprising:
a substrate;
at least a first region having a plurality of active regions and a plurality of gate line regions defined on the substrate;
a plurality of square contact units respectively positioned in the active region of the first region; and
a plurality of rectangle contact units respectively positioned in the gate line region of the first region, a width-to-length ratio of the rectangle contact unit is between 1:1.8 and 1:1.2.

8. The contact layout structure of claim 7, wherein the first region comprises a dense region.

9. The contact layout structure of claim 8, wherein the first region comprises a SRAM region.

10. The contact layout structure of claim 7, wherein long sides of each rectangle contact unit are parallel with an extending direction of the gate line regions.

* * * * *